United States Patent
Tang et al.

(10) Patent No.: US 9,638,712 B2
(45) Date of Patent: May 2, 2017

(54) MEMS DEVICE WITH OVER-TRAVEL STOP STRUCTURE AND METHOD OF FABRICATION

(71) Applicant: FREESCALE SEMICONDUCTOR, INC., Austin, TX (US)

(72) Inventors: Jun Tang, Tempe, AZ (US); Chad S. Dawson, Queen Creek, AZ (US); Andrew C. McNeil, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 161 days.

(21) Appl. No.: 14/603,016

(22) Filed: Jan. 22, 2015

(65) Prior Publication Data

US 2016/0216290 A1    Jul. 28, 2016

(51) Int. Cl.
*G01P 15/125*    (2006.01)
*G01P 15/08*    (2006.01)
*B81B 3/00*    (2006.01)
*B81C 1/00*    (2006.01)
*G01P 15/18*    (2013.01)

(52) U.S. Cl.
CPC .......... *G01P 15/125* (2013.01); *B81B 3/0051* (2013.01); *B81C 1/00849* (2013.01); *G01P 15/0802* (2013.01); *B81B 2201/0235* (2013.01); *G01P 15/18* (2013.01); *G01P 2015/0831* (2013.01); *G01P 2015/0871* (2013.01)

(58) Field of Classification Search
CPC .......... G01P 15/125; G01P 2015/0871; B81B 3/0051
USPC ...................................... 73/514.32
See application file for complete search history.

(56) References Cited

U.S. PATENT DOCUMENTS

| 5,121,633 | A | * | 6/1992 | Murakami | ............ | G01P 15/123 |
| | | | | | | 338/46 |
| 5,490,421 | A | * | 2/1996 | Ueyanagi | ................ | G01P 15/12 |
| | | | | | | 338/2 |
| 5,914,521 | A | * | 6/1999 | Gutteridge | ............ | B81B 3/0051 |
| | | | | | | 257/415 |
| 6,228,275 | B1 | * | 5/2001 | Koch | ................... | G01P 15/0802 |
| | | | | | | 216/2 |
| 6,318,174 | B1 | | 11/2001 | Schmiesing et al. | | |
| 6,634,232 | B1 | * | 10/2003 | Rettig | ................... | B81B 3/0051 |
| | | | | | | 73/514.15 |
| 7,121,141 | B2 | | 10/2006 | McNeil | | |
| 7,232,701 | B2 | * | 6/2007 | Gogoi | ................... | B81B 3/0051 |
| | | | | | | 438/51 |

(Continued)

*Primary Examiner* — Helen Kwok
(74) *Attorney, Agent, or Firm* — Charlene R. Jacobsen

(57) ABSTRACT

A MEMS device comprises a substrate, a proof mass spaced apart from a surface of the substrate, and an over-travel stop structure. The over-travel stop structure includes a lateral stop structure and a cap coupled to the lateral stop structure. The MEMS device is fabricated to include relatively small gap sections and relatively large gap regions separating the lateral stop structure from the proof mass. The larger gap regions are covered by the cap and the smaller gap sections are exposed from the gap. During fabrication, removal of particles from the smaller gap sections is facilitated by their exposure from the cap and removal of particles from the larger gap regions underlying the cap is facilitated by their larger size. The lateral stop structure may be cross-shaped to limit deflection of the proof mass along two in-plane axes. The cap limits deflection of the proof mass along an out-of-plane axis.

16 Claims, 10 Drawing Sheets

(56) References Cited

U.S. PATENT DOCUMENTS

| | | | | |
|---|---|---|---|---|
| 7,464,591 | B2* | 12/2008 | Fukuda | G01P 15/08 |
| | | | | 73/514.36 |
| 7,640,805 | B2* | 1/2010 | Diamond | B81C 1/00246 |
| | | | | 73/514.32 |
| 7,905,146 | B2* | 3/2011 | Suzuki | G01C 19/56 |
| | | | | 73/514.33 |
| 8,124,895 | B2* | 2/2012 | Merassi | B81B 3/0051 |
| | | | | 200/61.53 |
| 8,186,220 | B2 | 5/2012 | Geisberger et al. | |
| 8,671,757 | B2* | 3/2014 | Reinmuth | B81B 3/0051 |
| | | | | 73/514.32 |
| 2002/0112538 | A1* | 8/2002 | Pinter | B81B 3/0008 |
| | | | | 73/514.32 |
| 2012/0216616 | A1* | 8/2012 | Schultz | G01P 15/125 |
| | | | | 73/514.38 |
| 2012/0280591 | A1* | 11/2012 | Schultz | B81B 3/0016 |
| | | | | 310/300 |
| 2012/0297879 | A1* | 11/2012 | Ullrich | G01P 15/125 |
| | | | | 73/514.32 |
| 2013/0111992 | A1* | 5/2013 | O'Brien | G01P 15/125 |
| | | | | 73/504.12 |

* cited by examiner

158

164

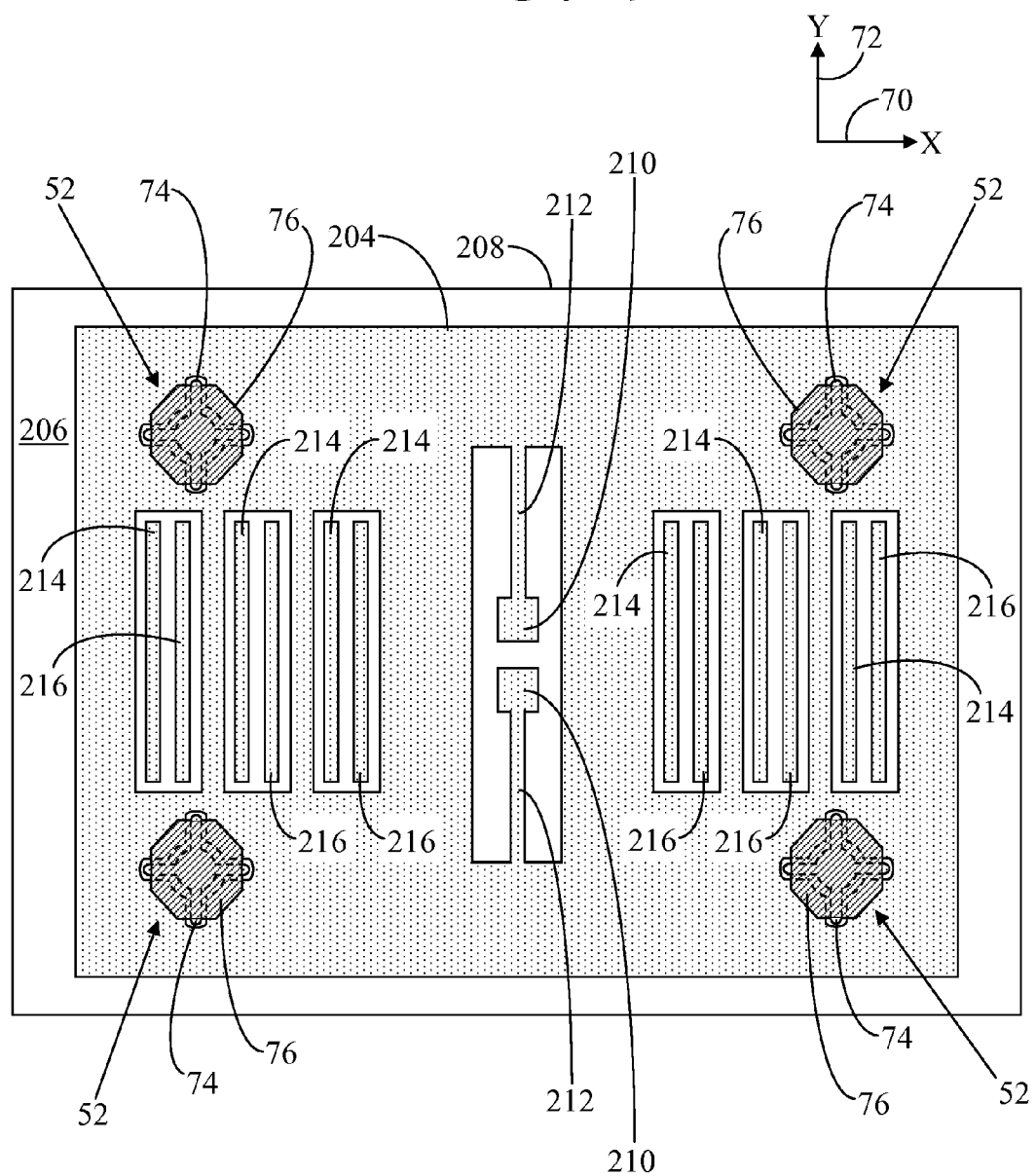

MEMS DEVICE WITH OVER-TRAVEL STOP STRUCTURE AND METHOD OF FABRICATION

TECHNICAL FIELD OF THE INVENTION

The present invention relates generally to microelectromechanical systems (MEMS) devices. More specifically, the present invention relates to a MEMS device with an over-travel stop structure arranged to limit deflection of a proof mass.

BACKGROUND OF THE INVENTION

Microelectromechanical systems (MEMS) technology has achieved wide popularity in recent years, as it provides a way to make very small mechanical structures and integrate these structures with electrical devices on a single substrate using conventional batch semiconductor processing techniques. One common application of MEMS is the design and manufacture of sensor devices. MEMS sensors are widely used in applications such as automotive, inertial guidance systems, household appliances, game devices, protection systems for a variety of devices, and many other industrial, scientific, and engineering systems.

One particular type of MEMS sensor that is used in a variety of applications is an accelerometer. Typically, a MEMS accelerometer includes, among other component parts, a movable element, also referred to as a proof mass. The proof mass is resiliently suspended by one or more compliant suspension springs such that it moves when the MEMS accelerometer experiences acceleration. The motion of the proof mass may then be converted into an electrical signal having a parameter magnitude (e.g., voltage, current, frequency, etc.) that is proportional to the acceleration.

In some instances, a MEMS accelerometer may experience harsh accelerations or a relatively high force. In such an instance, the proof mass can move beyond a desired distance. Such movement can potentially damage the MEMS accelerometer and/or cause unstable behavior of the MEMS accelerometer. Accordingly, over-travel stops are typically used in accelerometers for limiting the excessive motion of the proof mass under relatively high acceleration. Various over-travel stops limit motion of the proof mass in three axes, i.e., two in-plane axes and one out-of-plane axis, in order to prevent circuit shortage, high wear rate, fracture, stiction, and so forth.

Referring to FIGS. 1-2, FIG. 1 shows a top view of a prior art inertial sensor, for example, an accelerometer 20 having over-travel stops 22, and FIG. 2 shows a sectional side view of accelerometer 20 along section lines 2-2 of FIG. 1. Accelerometer 20 includes a proof mass 24 suspended above and anchored to a substrate 26 via one or more proof mass anchors 28. More particularly, one or more compliant members 30, or springs, interconnect proof mass 24 with proof mass anchors 28. Fixed electrodes 32 (represented by dashed line boxes) underlie proof mass 24. Fixed electrodes 32, which may be some combination of sense electrodes and actuator electrodes, are formed or otherwise attached to substrate 26. Accelerometer 20 represents a typical single axis accelerometer. Accordingly, compliant members 30 enable movement of proof mass 24 about a rotational axis 34 when accelerometer 20 experiences acceleration in a z-direction 36 substantially perpendicular to the surface of substrate 26. Movement of proof mass 24 alters capacitances between proof mass 24 and fixed electrodes 32, and these capacitances are used to determine acceleration.

Over-travel stops 22 limit the movement, or deflection, of proof mass 24 when accelerometer 20 experiences harsh or excessive acceleration. In this example, over-travel stops 22 are configured to limit motion of proof mass 24 in three axes, two in-plane axes and one out-of-plane axis. Accordingly, each of over-travel stops 22 can include a lateral stop structure 38 and a cap 40. Lateral stop structure 38 is coupled to substrate 26 and limits in-plane deflection of proof mass 24. Cap 40 is coupled to lateral stop structure 38 and limits out-of-plane motion of proof mass 24.

Gaps 42 between lateral stop structures 38 and proof mass 24 are typically as small as one micron to limit the motion of proof mass 24 and prevent over stressing of proof mass 24. These gaps 42 are covered by caps 40. Fabrication operations can result in byproducts or debris falling into and getting lodged in gaps 42. This debris is referred to herein as particles 44. The small size of gaps 42, covered with caps 40, results in a situation in which particles 44 cannot be completely rinsed out of gaps 42 following fabrication processes. The residual particles 44 can prevent proof mass 24 from moving as a function of the acceleration, resulting in failure and yield loss for accelerometers.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

FIG. 19 shows a top view of a MEMS device having over-travel stop structures in accordance with another embodiment.

DETAILED DESCRIPTION

In overview, the present disclosure concerns microelectromechanical systems (MEMS) device configurations having at least one over-travel stop structure. The present disclosure further concerns methodology for fabricating the MEMS device configurations. The MEMS device may be an inertial sensor, such as an accelerometer, having a movable element, referred to herein as a proof mass. The over-travel stop structure limits deflection of the proof mass in at least two directions. The over-travel stop structure includes a lateral stop structure and a cap. The lateral stop structure is separated from the proof mass by small and large gaps, wherein the larger gaps are covered by the cap and the smaller gaps are exposed from the gap. During fabrication, the removal of debris from the smaller gaps is facilitated by their exposure from the cap and removal of debris from the gaps underlying the cap is facilitated by their larger size. Thorough removal of debris from the gaps can reduce failure rate and yield loss for such inertial sensors.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

Figure 3:
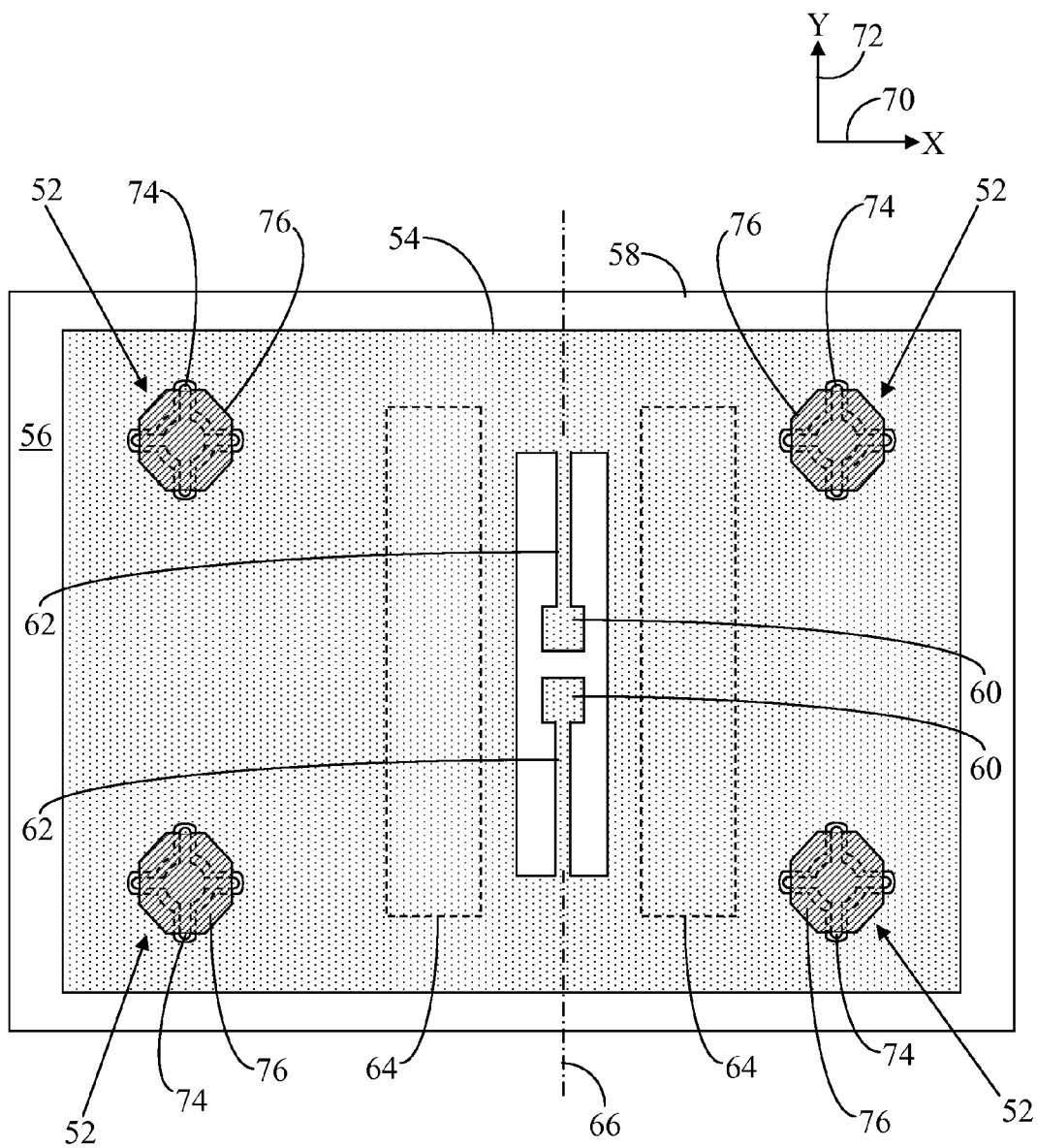
FIG. 3 shows a top view of a MEMS device having over-travel stop structures in accordance with an embodiment.

FIG. 3 shows a top view of a MEMS device 50 having over-travel stop structures 52 in accordance with an embodiment. MEMS device 50 may be an inertial sensor having at least one movable component. More particularly, MEMS device 50 is described herein as being an accelerometer that includes, among other component parts, a proof mass that moves when the accelerometer experiences acceleration. Accordingly, MEMS device 50 is referred to hereinafter as accelerometer 50. Over-travel stop structures 52 limit deflection of the proof mass when accelerometer 50 is subject to harsh acceleration or force. It should be understood, however, that over-travel stop structures 52 may be implemented in another structural configurations to limit the deflection of a movable component.

Accelerometer 50 includes a proof mass 54 positioned in spaced apart relationship above a surface 56 of a substrate 58. More particularly, proof mass 54 is suspended above and anchored to surface 56 of substrate 58 via one or more proof mass anchors 60. One or more compliant members 62, or springs, interconnect proof mass 54 with proof mass anchors 60. Fixed electrodes 64 (represented by dashed line boxes) underlie proof mass 54. Fixed electrodes 64, which may be some combination of sense electrodes and actuator electrodes, are formed or otherwise attached to surface 56 of substrate 58.

Compliant members 62 enable movement of proof mass 54 about a rotational axis 66 when accelerometer 50 experiences acceleration in a z-direction 68 (see FIG. 5) substantially perpendicular to surface 56 of substrate 58. Movement of proof mass 54 alters capacitances between proof mass 54 and fixed electrodes 64, and these capacitances are used to determine acceleration. Accelerometer 50 represents a typical single axis teeter-totter style accelerometer. It should be understood, however, that in alternative configurations, accelerometer 50 may be configured to sense acceleration along more than one axis, for example, along axes that are parallel to surface 56 of substrate 58. As known to those skilled in the art, the fixed and movable electrodes would be configured differently than fixed electrodes 64 underlying proof mass 54 in these alternative configurations.

Over-travel stop structures 52 limit the movement, or deflection, of proof mass 54 when accelerometer 50 experiences harsh or excessive acceleration. In this example, over-travel stop structures 52 are configured to limit motion of proof mass 54 in three axes, two in-plane axes (i.e., an x-direction 70 and a y-direction 72) and one out-of-plane axis (z-direction 68). Accordingly, each of over-travel stop structures 52 includes a lateral stop structure 74 and a cap 76. Lateral stop structure 74 is coupled to substrate 58 and is positioned in proximity to proof mass 54. Lateral stop structure 74 limits in-plane deflection (i.e., x-direction 70 and y-direction 72) of proof mass 54. Cap 76 is coupled to lateral stop structure 66 and limits out-of-plane deflection (z-direction 68) of proof mass 54. As illustrated, accelerometer 50 includes four over-travel stop structures 52. However, accelerometer 50 may include fewer than or more than the four over-travel stop structures 52 shown.

FIG. 3 and subsequent FIGS. 4-5 and 7-19 are illustrated using various shading and/or hatching to distinguish the different elements of accelerometer 50, as will be discussed below. These different elements within the structural layers may be produced utilizing current and upcoming micromachining techniques of depositing, patterning, etching, and so forth. It should be further understood that the use of relational terms, if any, such as first and second, top and bottom, and the like are used solely to distinguish one from another entity or action without necessarily requiring or implying any actual such relationship or order between such entities or actions.

Figure 4:
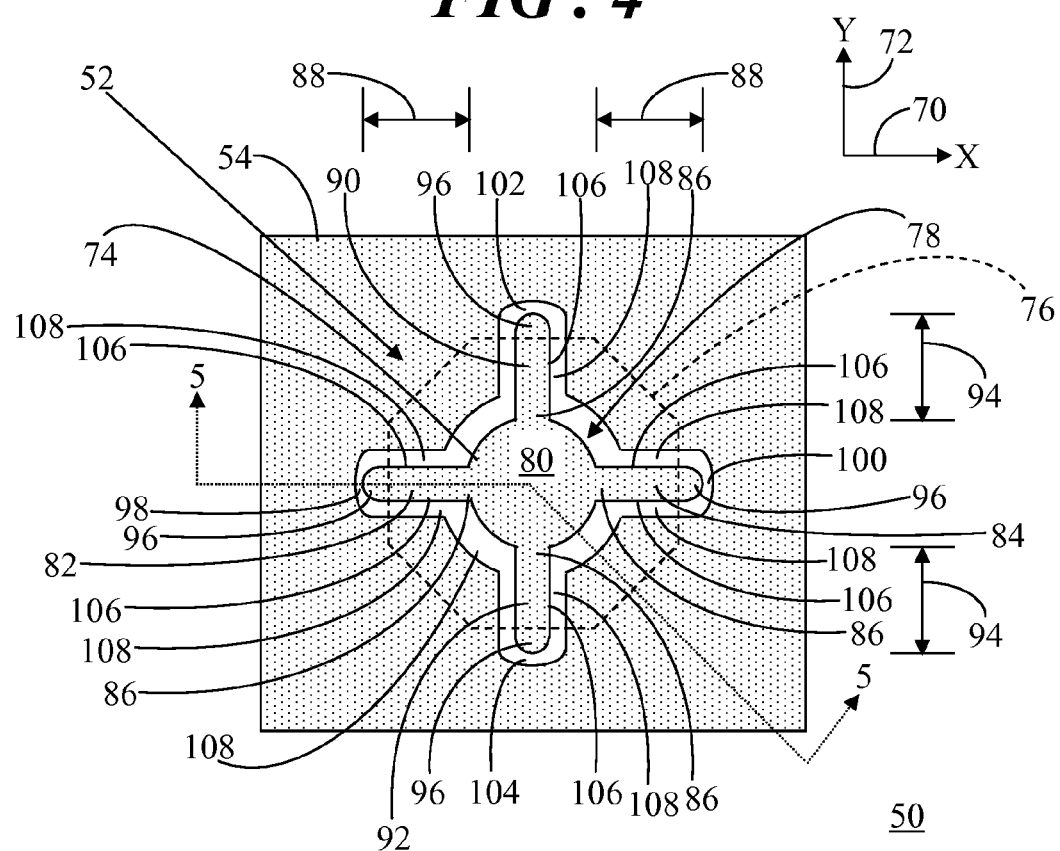
FIG. 4 shows a partial top view of the accelerometer of FIG. 3.
Figure 5:
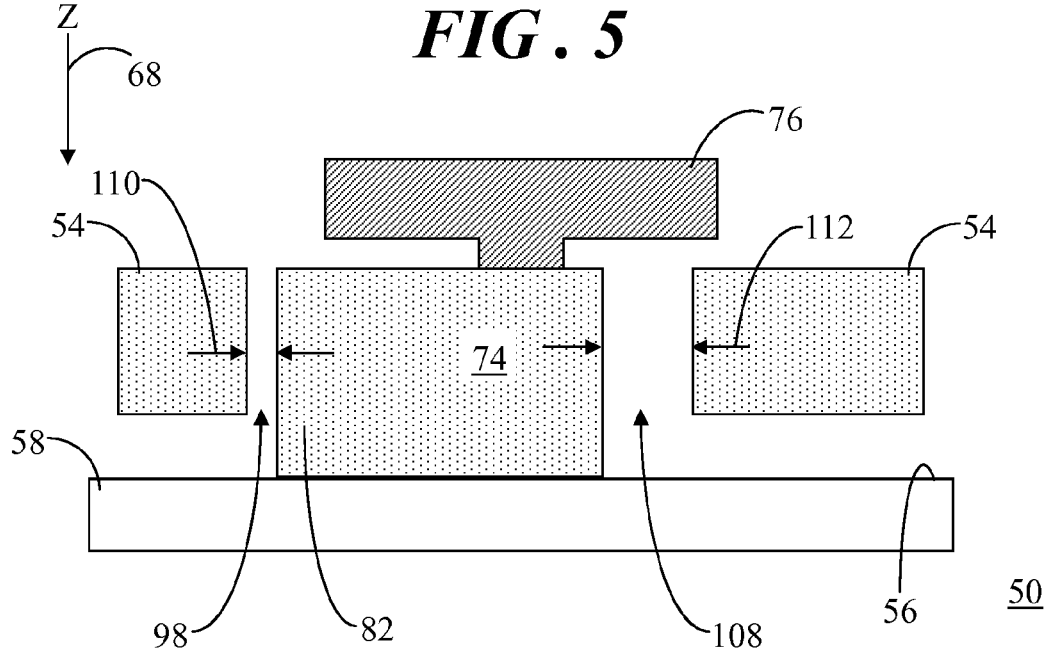
FIG. 5 shows a side view of the accelerometer of FIG. 3 along section lines 5-5 shown in FIG. 4.

Referring now to FIGS. 4-5 in connection with FIG. 3, FIG. 4 shows a partial top view of accelerometer 50, and FIG. 5 shows a side view of accelerometer 50 along section lines 5-5 shown in FIG. 4. In FIG. 4, cap 76 is represented in by a dashed line octagon in order to show its relationship to the underlying lateral stop structure 74. Over-travel stop structure 52 is described in singular form for simplicity. It should be readily apparent that the following discussion applies equally to each of over-travel stop structures 52.

In an embodiment, lateral stop structure 74 resides in an opening 78 extending through proof mass 54. Lateral stop structure 74 includes a central anchor 80 coupled to surface 56 of substrate 58. Lateral stop structure 74 further includes a first extension member 82 and a second extension member 84 extending from opposing sides of central anchor 80. That is, each of first and second extension members 82, 84 includes a proximal end 86 coupled to central anchor 80. A length 88 of each of first and second extension members 82, 84 is aligned substantially parallel with x-direction 70, wherein x-direction 70 is a first direction of movement of proof mass 54.

Lateral stop structure 74 additionally includes a third extension member 90 and a fourth extension member 92 extending from opposing sides of central anchor 80. That is, each of third and fourth extension members 90, 92 also includes proximal end 86 coupled to central anchor 80. A length 94 of each of third and fourth extension members 90, 92 is aligned substantially parallel with y-direction 72, wherein y-direction 72 is a second direction of movement of proof mass 54. Length 94 of third and fourth extension members 90, 92 is oriented approximately perpendicular to length 88 of first and second extension members 82, 84 to form a cross-shaped lateral stop structure 74.

A distal end 96 of first extension member 82 is laterally spaced apart from proof mass 54 by a first gap section 98. Similarly, distal end 96 of second extension member 84 is spaced apart from proof mass 54 by a second gap section 100. Distal end 96 of third extension member 90 is spaced apart from proof mass 54 by a third gap section 102, and distal end 96 of fourth extension member 92 is spaced apart from proof mass 54 by a fourth gap section 104. Each of first, second, third, and fourth extension members 82, 84, 90, 92 has side walls 106 extending between their corresponding proximal and distal ends 86, 96. Side walls 106 are spaced apart from proof mass 54 by gap regions 108. Likewise, side walls of central anchor 80 are spaced apart from proof mass 54 by gap regions 108.

Each of first, second, third, and fourth gap sections 98, 100, 102, and 104 is exposed from cap 76. Conversely, gap regions 108 between side walls 106 and proof mass 54 underlie cap 76. Accordingly, an entirety of each of first, second, third, and fourth gap sections 98, 100, 102, and 104 are not covered by cap 76. Whereas, all of gap regions 108 are covered by cap 76. As most readily visualized in FIGS. 4 and 5, each of first, second, third, and fourth gap sections 98, 100, 102, and 104 exposed from cap 76 has a first width 110, i.e., a magnitude of separation, between their corresponding first, second, third, and fourth extension members 82, 84, 90, 92, and proof mass 54. Additionally, each of gap regions 108 underlying cap 76 has a second width 112, i.e., a magnitude of separation, between their corresponding side walls 106 and proof mass 54.

Figure 1:
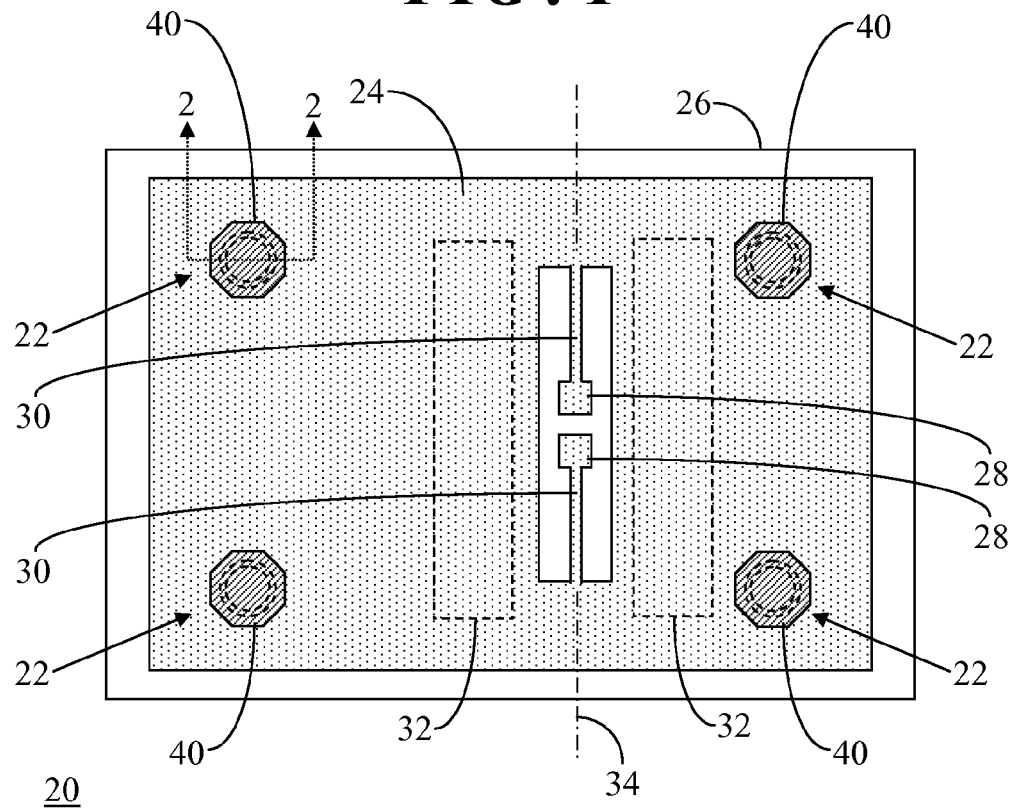
FIG. 1 shows a top view of a prior art inertial sensor, for example, an accelerometer having over-travel stops.
Figure 2:
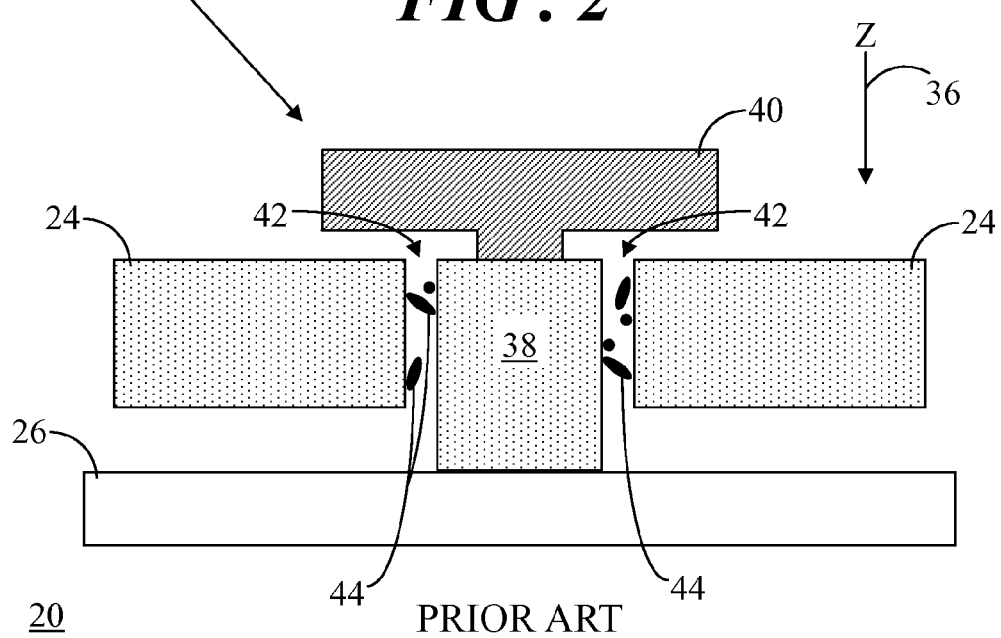
FIG. 2 shows a sectional side view of the prior art accelerometer along section lines 2-2 of FIG. 1.

Second width 112 is greater than first width 110. That is, the separation at gap regions 108 that underlie cap 76 (between lateral stop structure 74 and proof mass 54) is greater than the separation at gap sections 98, 100, 102, and 104 that are exposed from cap 76 (between lateral stop structure 74 and proof mass 54). In some embodiments, the entirely exposed first width 110 of gap sections 98, 100, 102, and 104 may be no greater than one micron, while second width 112 of gap regions 108 underlying cap 76 is greater than one micron. The one micron or less first width 110 suitably limits the deflection of proof mass 54 in x-direction 70 and y-direction 72 and therefore prevents over stressing of proof mass 54 under conditions of harsh or excessive acceleration. However, since the entirety of first width 110 of each of gap sections 98, 100, 102, and 104 is exposed from cap 76, residual particles 44 (FIG. 2) that are produced during fabrication can be readily removed during, for example, a rinse process. Conversely, since second width 112 of gap regions 108 underlying cap 76 is relatively large, residual particles 44 in gap regions 108 can still be readily removed during, for example, the rinse process. This structural configuration enables the use of cap 76 to limit deflection of proof mass 54 away from surface 56 of substrate 58 while reducing the potential for yield loss by enabling thorough removal of residual particles 44.

Figure 6:
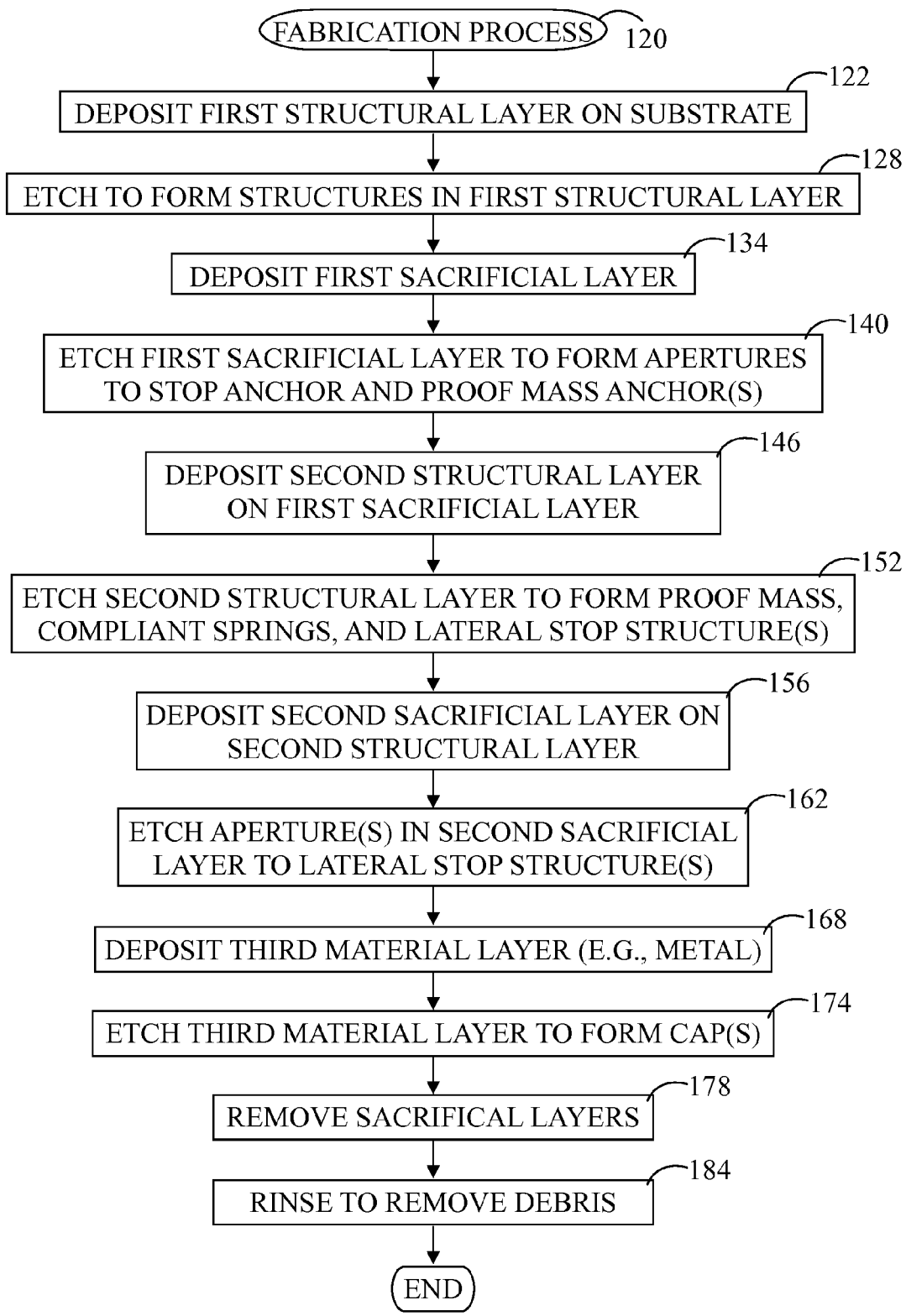
FIG. 6 shows a flowchart of a fabrication process for producing the accelerometer of FIG. 3 in accordance with another embodiment.

FIG. 6 shows a flowchart of a fabrication process 120 for producing accelerometer 50 (FIG. 3) in accordance with another embodiment. Fabrication process 120 is performed to produce accelerometer 50 having one or more over-travel stop structures 52 (FIG. 3). It should be understood, however, that fabrication process 120 may be performed to produce an accelerometer or other inertial sensor having a different structural configuration, but still including one or more over-travel stop structures 52.

Fabrication process 120 provides a generalized description of the operations, subdivided into process blocks, that are performed to produce accelerometer 50. A number of pretreatment operations and suboperations known to those skilled in the art are not listed for brevity. Additionally, fabrication process 120 is described in the context of fabricating a single accelerometer 50. Those skilled in the art will readily recognize that fabrication process 120 may be executed as a wafer level fabrication process to concurrently produce a plurality of MEMS devices having one or more over-travel stop structures 52.

The various process blocks of fabrication process 120 are discussed in connection with the subsequent FIGS. 7-18. Therefore, fabrication process 120 should be viewed concurrently with the corresponding descriptions of FIGS. 7-18. Additionally, the views presented in FIGS. 7-18 correspond to the enlarged sectional view of accelerometer 50 shown in FIG. 5. Of course, it should be readily apparent to those skilled in the art that fabrication of accelerometer 50 entails fabrication of the entire MEMS device and not just the portion shown in FIG. 5.

Figure 7:
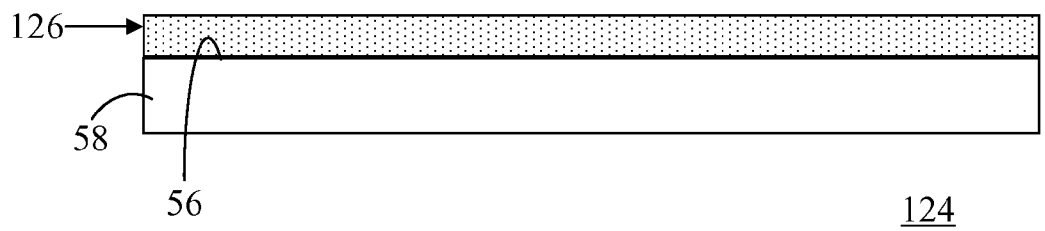
FIG. 7 shows a side view of a structure at an initial stage of fabrication in accordance with the fabrication process of FIG. 6.

At a block 122 of fabrication process 120, a first structural layer is deposited on a substrate. Referring to FIG. 7 in connection with block 122, FIG. 7 shows a side view of a portion of a structure at an initial stage 124 of fabrication in accordance with the fabrication process 120. As shown, a first structural layer 126 is deposited on surface 56 of substrate 58. First structural layer 126 may be polysilicon or any other suitable material layer.

Figure 8:
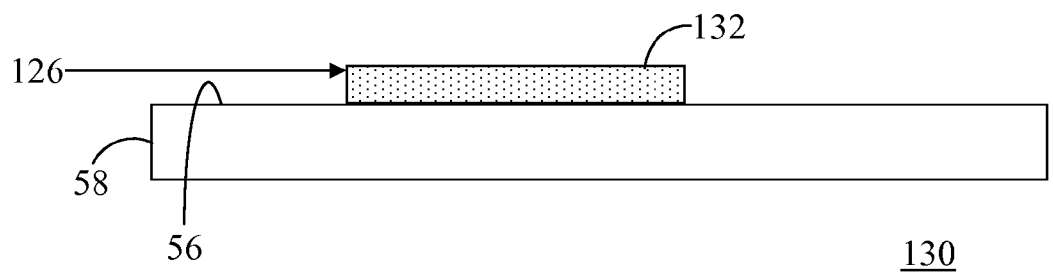
FIG. 8 shows a side view of the structure of FIG. 7 at a subsequent stage of fabrication.

Fabrication process 120 continues at a block 128. At block 128, the first structural layer is etched to form structures in the first structural layer. Referring to FIG. 8 in connection with block 128, FIG. 8 shows a side view of the structure of FIG. 7 at a subsequent stage 130 of fabrication. As shown, first structural layer 126 has been suitably etched or otherwise removed to form, for example, proof mass anchors 60 (FIG. 3), a stop anchor 132, and fixed electrodes (FIG. 3) on surface 56 of substrate 58.

Figure 9:
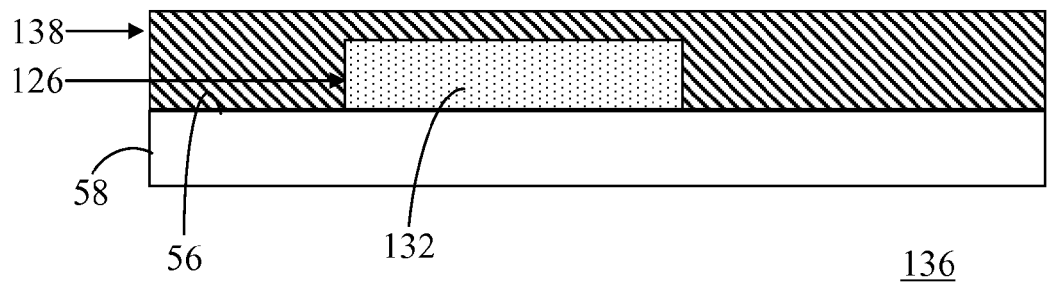
FIG. 9 shows a side view of the structure of FIG. 8 at a subsequent stage of fabrication.

Fabrication process 120 continues at a block 134. At block 134, a first sacrificial layer may be deposited over the elements formed in the first structural layer as well as over the exposed regions of the substrate. With reference to FIG. 9 in connection with block 134, FIG. 9 shows a side view of the structure of FIG. 8 at a subsequent stage 136 of fabrication. As shown, a first sacrificial layer 138 is deposited over surface 56 of substrate 58 and over stop anchor 132. Although not shown, first sacrificial layer 138 may be deposited over the other structures formed in first structural layer 126 as well. First sacrificial layer 138 may be an oxide or any other suitable material layer.

Figure 10:
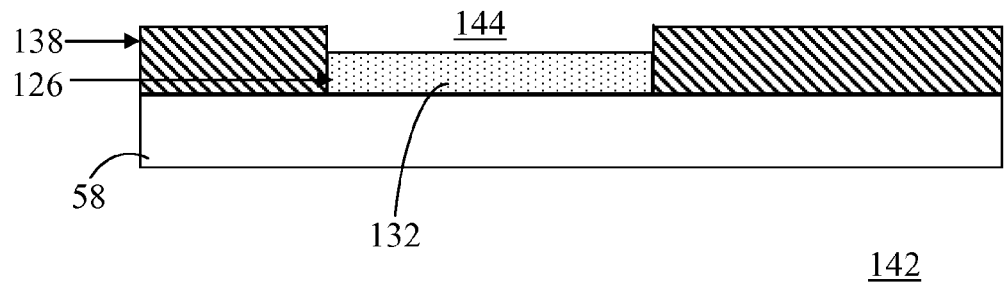
FIG. 10 shows a side view of the structure of FIG. 9 at a subsequent stage of fabrication.

Fabrication process 120 continues at a block 140. At block 140, the first sacrificial layer is etched to form apertures to certain components formed in the first structural layer. Referring to FIG. 10 in connection with block 140, FIG. 10 shows a side view of the structure of FIG. 9 at a subsequent stage 142 of fabrication. As shown, first sacrificial layer 138 has been etched to form an aperture 144 to stop anchor 132. Although not shown, first sacrificial layer 138 may be suitably etched to form apertures to other stop anchors 132 and to the proof mass anchors as well.

Figure 11:
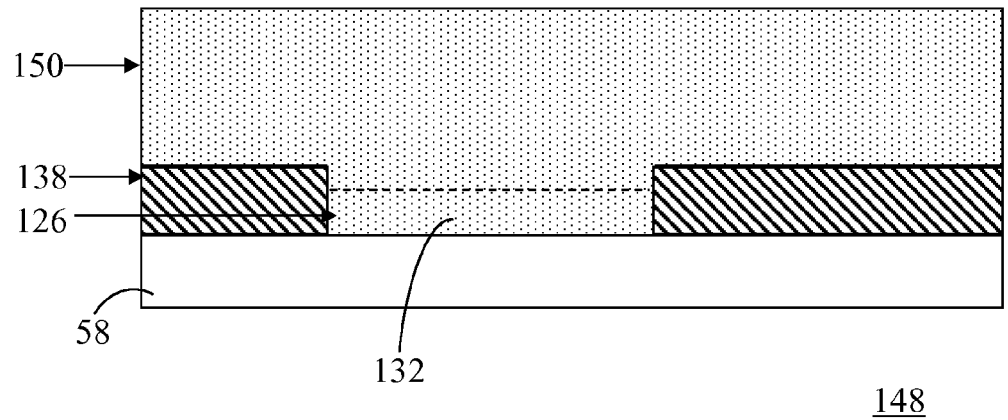
FIG. 11 shows a side view of the structure of FIG. 10 at a subsequent stage of fabrication.

At a block 146 of fabrication process 120, a second structural layer is deposited on the first sacrificial layer. Referring to FIG. 11 in connection with block 146, FIG. 11 shows a side view of the structure of FIG. 10 at a subsequent stage 148 of fabrication. As shown, a second structural layer 150, which may be polysilicon, is deposited on first sacrificial layer 138. Additionally, second structural layer 150 fills aperture 144 (FIG. 10) and therefore couples with stop anchor 132. Stop anchor 132 is distinguished from second structural layer 150 by a dashed line in FIG. 11. Of course, second structural layer 150 additionally fills other apertures (not shown) to other stop anchors 132 and to the proof mass anchors.

Figure 12:
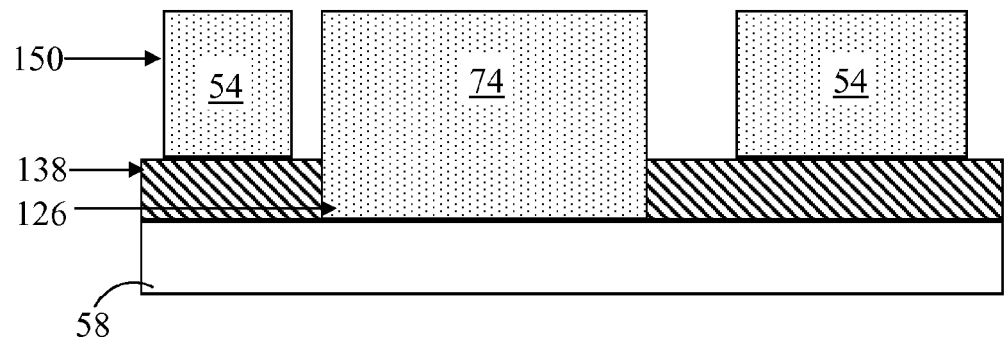
FIG. 12 shows a side view of the structure of FIG. 11 at a subsequent stage of fabrication.

At a block 152 of fabrication process 120, the second structural layer is etched to form, for example, proof mass 54, compliant members 62, and lateral stop structures 74 of over-travel stop structures 52 (FIG. 3). Referring to FIG. 12 in connection with block 152, FIG. 12 shows a side view of the structure of FIG. 11 at a subsequent stage 154 of fabrication. As shown, second structural layer 150 has been suitably etched or otherwise removed to form, for example, proof mass 54 and lateral stop structure 74. Second structural layer 150 has also been suitably etched or otherwise removed to form compliant members 62 (not shown).

Figure 13:
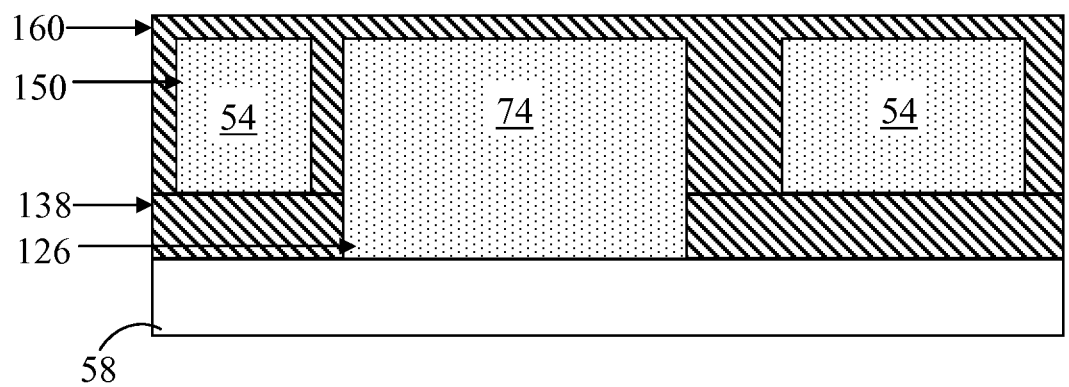
FIG. 13 shows a side view of the structure of FIG. 12 at a subsequent stage of fabrication.

At a block 156 of fabrication process 120, a second sacrificial layer is deposited on the second structural layer. Referring to FIG. 13 in connection with block 156, FIG. 13 shows a side view of the structure of FIG. 12 at a subsequent stage 158 of fabrication. As shown, a second sacrificial layer 160, which may be an oxide, is deposited over the etched components in second structural layer 150 and in any apertures between the etched components. Thus, second sacrificial layer 160 is deposited over proof mass 54, lateral stop structure 64, and compliant members 62 (not shown).

Figure 14:
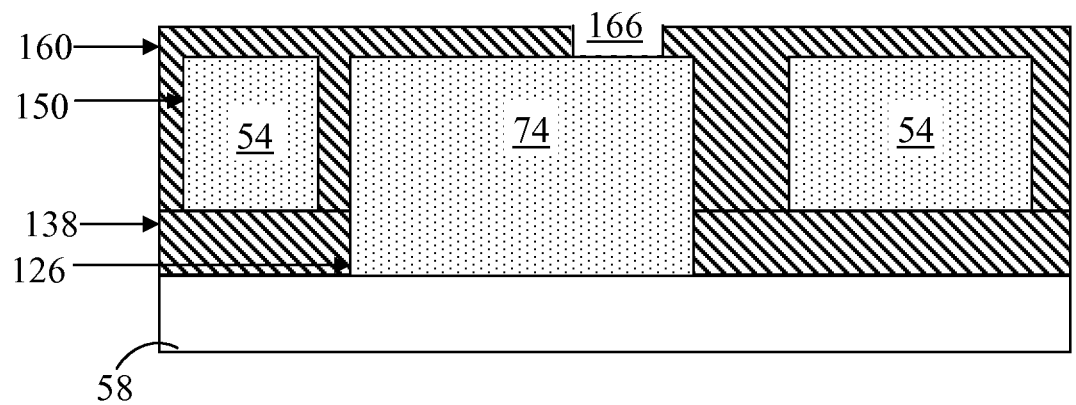
FIG. 14 shows a side view of the structure of FIG. 13 at a subsequent stage of fabrication.

At a block 162 of fabrication process 120, the second sacrificial layer is etched to form apertures to certain components formed in the second structural layer. Referring to FIG. 14 in connection with block 162, FIG. 14 shows a side view of the structure of FIG. 13 at a subsequent stage 164 of fabrication. As shown, second sacrificial layer 160 has been etched to form an aperture 166 to lateral stop structure 74.

Figure 15:
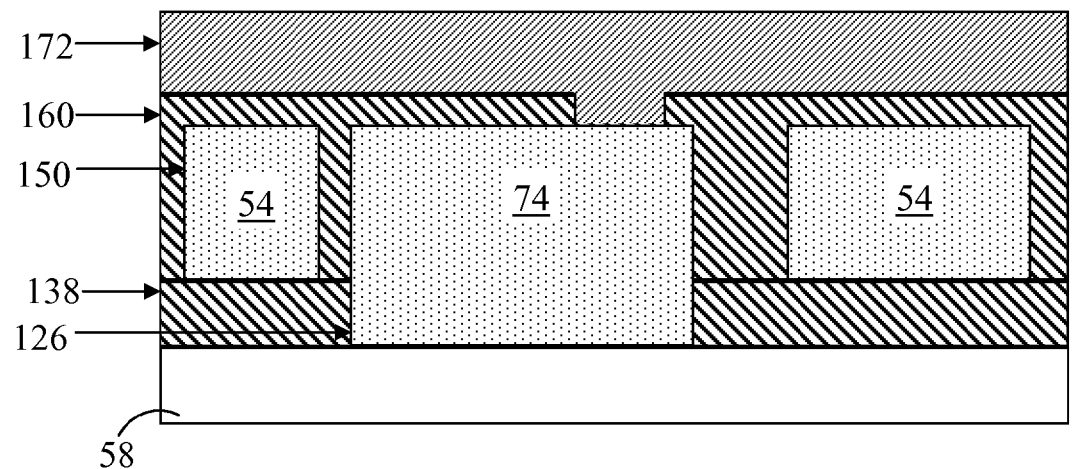
FIG. 15 shows a side view of the structure of FIG. 14 at a subsequent stage of fabrication.

At a block 168 of fabrication process 120, a third material layer is deposited over the second sacrificial layer. Referring to FIG. 15 in connection with block 168, FIG. 15 shows a side view of the structure of FIG. 14 at a subsequent stage 170 of fabrication. As shown, a third material layer 172 is deposited on second sacrificial layer 160. Additionally, third material layer 172 fills aperture 166 (FIG. 14) and therefore couples with lateral stop structure 74. In some embodiments, third material layer 172 may be an electrically conductive metal that is used to form the bond pads (not shown) of accelerometer 50 (FIG. 3).

Figure 16:
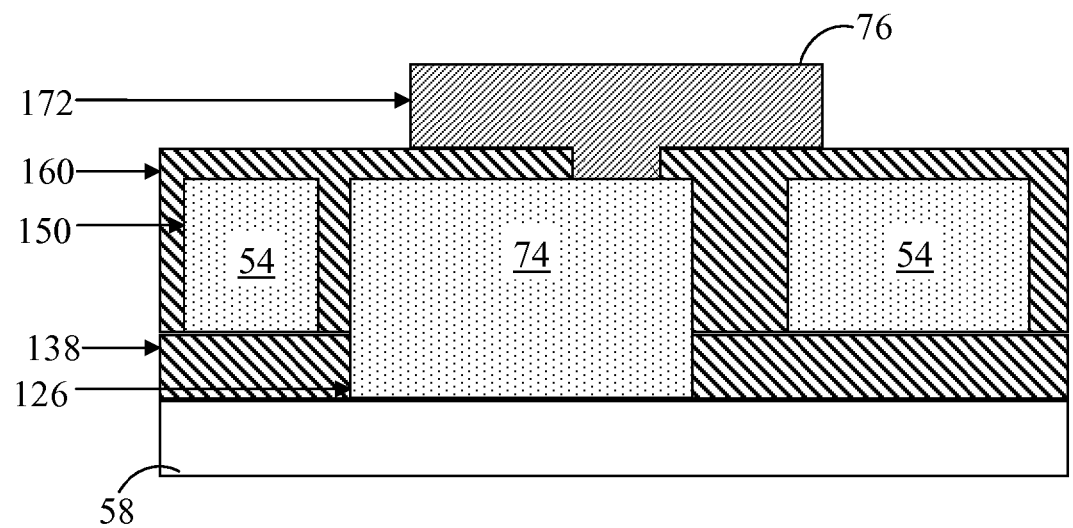
FIG. 16 shows a side view of the structure of FIG. 15 at a subsequent stage of fabrication.

At a block 174 of fabrication process 120, the third material layer is etched to form cap(s) 76 of over-travel stop structures 52 (FIG. 3). Referring to FIG. 16 in connection with block 174, FIG. 16 shows a side view of the structure of FIG. 15 at a subsequent stage 176 of fabrication. As shown, third material layer 172 has been suitably etched or otherwise removed to form cap 76 coupled with the underlying lateral stop structure 74. Third material layer 172 may also be etched to form bond pads (not shown) of accelerometer 50.

Figure 17:
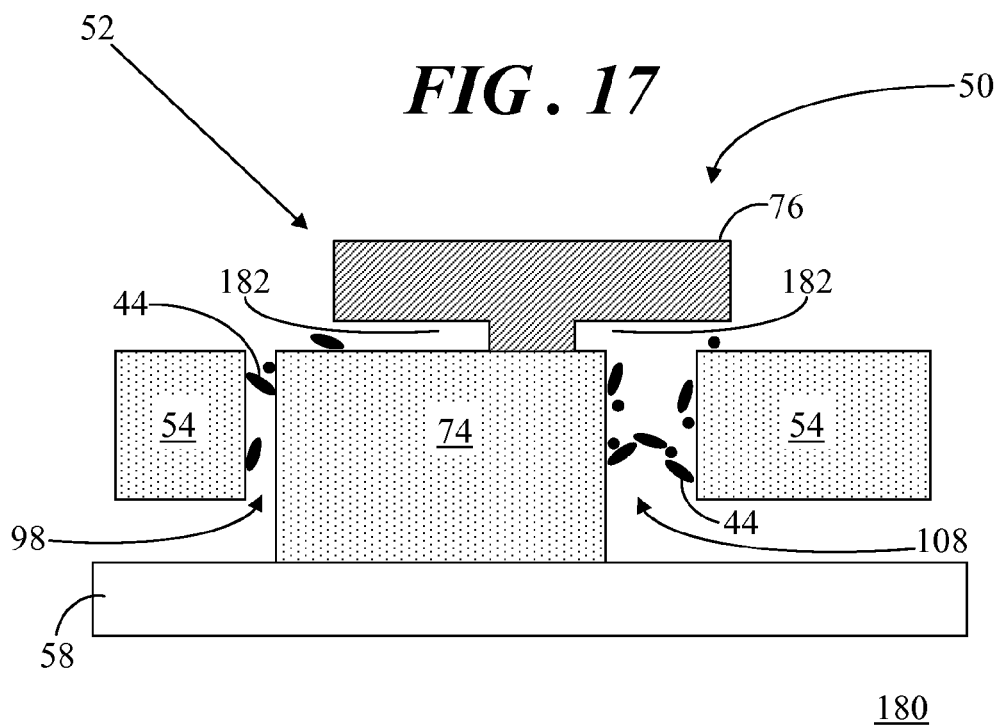
FIG. 17 shows a side view of the structure of FIG. 16 at a subsequent stage of fabrication.

At a block 178 of fabrication process 120, the sacrificial layers are removed. Referring to FIG. 17 in connection with block 178, FIG. 17 shows a side view of the structure of FIG. 16 at a subsequent stage 180 of fabrication. As shown, first and second sacrificial layers (FIG. 16) have been removed by etching to release proof mass 54 of accelerometer 50 from the underlying substrate 58, to produce gap section 98 and gap region 108 between proof mass 54 and lateral stop structure 74, and to produce a gap 182 between cap 76 and the underlying portions of proof mass 54 and lateral stop structure 74. Following the various etch operations, accelerometer 50 may have particles 44 resident in gap section 98 and gap region 108, as well as in gap sections 100, 102, 104 (FIG. 4).

Figure 18:
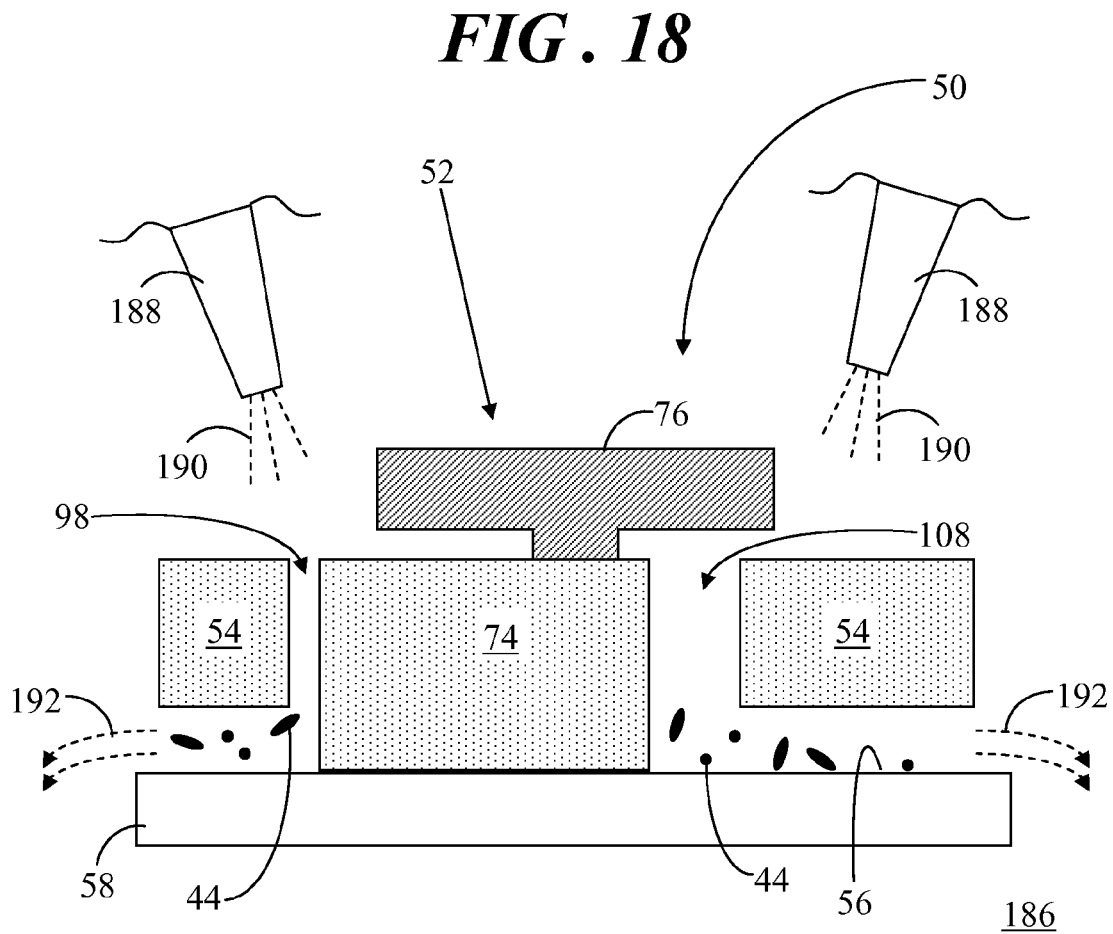
FIG. 18 shows a side view of the structure of FIG. 17 at a subsequent stage of fabrication.

At a block 184 of fabrication process 120, the accelerometer is rinsed or otherwise cleaned to remove the debris. Referring to FIG. 18 in connection with block 184, FIG. 18 shows a side view of the structure of FIG. 17 at a subsequent stage 186 of fabrication. As shown, nozzles 188, suitably positioned in proximity to accelerometer 50, discharge a fluid 190 that rinses particles 44 out of gap section 98 and gap region 108. Fluid 190 may be a liquid, a gas, or some combination thereof. As shown, particles 44 are driven toward surface 56 of substrate 58. They can then be driven outward, as represented by arrows 192, to the outer perimeter of accelerometer 50 where they are subsequently ejected from accelerometer 50. Thereafter, fabrication process 120 ends.

It is to be understood that certain ones of the process blocks depicted in FIG. 6 may be performed in parallel with each other or with performing other processes. In addition, it is to be understood that the particular ordering of the process blocks depicted in FIG. 6 may be modified, while achieving substantially the same result. Accordingly, such modifications are intended to be included within the scope of the inventive subject matter.

FIG. 19 shows a top view of a MEMS device 200 having over-travel stop structures 52 in accordance with another embodiment. As discussed in detail above, MEMS device 50 (FIG. 3), is adapted to detect acceleration in a z-direction substantially perpendicular to surface of substrate 58. In accordance with another embodiment, MEMS device 200 may be a lateral accelerometer adapted to detect acceleration in a direction substantially parallel to the surface of the substrate, e.g., in x-direction 70 and/or y-direction 72. Over-travel stop structures 52 limit deflection of the proof mass when accelerometer 200 is subject to harsh acceleration or force.

Accelerometer 200 includes a proof mass 204 positioned in spaced apart relationship above a surface 206 of a substrate 208. More particularly, proof mass 204 is suspended above and anchored to surface 206 of substrate 208 via one or more proof mass anchors 210. One or more compliant members 212, or springs, interconnect proof mass 204 with proof mass anchors 210. In this example, fixed electrodes 214, 216 reside in openings extending through proof mass 204. Fixed electrodes 214, 216, which may be some combination of sense electrodes and actuator electrodes, are formed or otherwise attached to surface 206 of substrate 208 so that they are immovable relative to proof mass 204.

Compliant members 212 enable lateral movement of proof mass 204 approximately parallel to surface 206 of substrate 208 when accelerometer 200 experiences acceleration in x-direction 70. Movement of proof mass 204 alters capacitances between proof mass 204 and fixed electrodes 214, 216, and these capacitances are used to determine acceleration. Compliant members 212 are shown as bars for simplicity of illustration. Those skilled in the art will recognize that compliant members 212 can take on a variety of shapes, thicknesses, and forms in order to enable suitable movement of proof mass 204 when accelerometer 200 experiences acceleration in x-direction 70.

Like the exemplary MEMS device 50 (FIG. 3), over-travel stop structures 52 limit the movement, or deflection, of proof mass 204 when accelerometer 200 experiences harsh or excessive acceleration. In this example, over-travel stop structures 52 are configured to limit motion of proof mass 204 in three axes, two in-plane axes (i.e., x-direction 70 and y-direction 72) and one out-of-plane axis (z-direction 68, see FIG. 5). Accordingly, each of over-travel stop structures 52 includes lateral stop structure 74 and cap 76. The particular configuration of over-travel stop structures 52 has been described in detail above. Therefore, a detailed description of over-travel stop structures 52, including lateral stop structure 74 and cap 76, will not be repeated for brevity.

Since proof mass 204 of MEMS device 200 is "flexible" in a lateral direction (e.g., x-direction 70) via compliant members 212, the one micron width 110 (see FIG. 5) of first, second, third, and fourth gap sections 98, 100, 102, 104 (see FIG. 5) may be particularly critical to limit potentially damaging stress issues associated with travelling a larger distance parallel to surface 206 of substrate 208. Additionally, under certain harsh accelerations, proof mass 204 could displace perpendicular to surface 206 of substrate 208. If cap 76 is not present, proof mass 204 might stack on, and become stuck to, lateral stop structure 74. Therefore, cap 76 limits undesirably large out of plane movement of proof mass 204 that might otherwise damage MEMS device 200.

Thus, a MEMS device having at least one over-travel stop structure and a method for fabricating the MEMS device have been described. An embodiment of a MEMS device comprises a substrate, a proof mass positioned in spaced apart relationship above a surface of the substrate, the proof mass being adapted to move relative to the substrate, and an over-travel stop structure. The over-travel stop structure includes a lateral stop structure coupled to the substrate and positioned in proximity to the proof mass. The lateral stop structure and the proof mass are spaced apart by a gap in a first direction of travel of the proof mass, the gap having a width. The lateral stop structure is configured to limit deflection of the proof mass in the first direction substantially parallel to the surface of the substrate. The over-travel stop structure further includes a cap coupled to the lateral stop structure and configured to limit deflection of the proof mass in a second direction away from the substrate, wherein the cap overlies at least a portion of the lateral stop structure with an entirety of the width of the gap being exposed from the cap.

An embodiment of a method of fabricating a MEMS device comprises forming at least one structure in a first structural layer on a surface of a substrate, the at least one structure including a proof mass anchor and a stop anchor, depositing a first sacrificial layer on the first structural layer, forming a proof mass and compliant springs in a second structural layer overlying the first sacrificial layer, the compliant springs interconnecting the proof mass with the proof mass anchor, and forming a lateral stop structure in the second structural layer. The lateral stop structure is coupled to the stop anchor and is positioned in proximity to the proof mass. The lateral stop structure and the proof mass are spaced apart by a gap in a first direction of travel of the proof mass, the gap having a first width. A second sacrificial layer is deposited on the second structural layer, and a cap is formed in a material layer overlying the second sacrificial layer. The cap is coupled with the lateral stop structure and the cap overlies at least a portion of the lateral stop structure with an entirety of the first width of the gap being exposed from the cap. The first and second sacrificial layers are removed to position the proof mass in spaced apart relationship above the surface of the substrate.

The device and process, discussed above, and the inventive principles thereof are intended to and can reduce fabrication related failure rate and yield loss for MEMS devices, such as accelerometers, having a movable element. More particularly, the MEMS device includes an over-travel stop structure having a lateral stop structure and a cap. The MEMS device is fabricated to include small and large gaps that separate the lateral stop structure from the proof mass. The larger gaps are covered by the cap and the smaller gaps are exposed from the gap. During fabrication, removal of particles from the smaller gaps is facilitated by their exposure from the cap and removal of debris from the gaps underlying the cap is facilitated by their larger size. Thorough removal of debris from these gaps can reduce the failure rate and yield loss for such MEMS devices.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to adapt it for various applications without departing from the general concept. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A microelectromechanical systems (MEMS) device comprising:
   a substrate;
   a proof mass positioned in spaced apart relationship above a surface of said substrate, said proof mass being adapted to move relative to said substrate; and
   an over-travel stop structure including:
      a lateral stop structure coupled to said substrate and positioned in proximity to said proof mass, said lateral stop structure and said proof mass being spaced apart by a gap in a first direction of travel of said proof mass, said gap having a first width, said lateral stop structure being configured to limit deflection of said proof mass in said first direction substantially parallel to said surface of said substrate; and
      a cap coupled to said lateral stop structure and configured to limit deflection of said proof mass in a second direction away from said substrate, wherein said cap overlies at least a portion of said lateral stop structure with an entirety of said first width of said gap being exposed from said cap, and said lateral stop structure and said proof mass are spaced apart by a gap region underlying said cap, said gap region exhibiting a second width that is greater than said first width.

2. The MEMS device of claim 1 wherein said first width of said gap is no greater than one micron.

3. The MEMS device of claim 1 wherein said first width is no greater than one micron, and said second width is greater than one micron.

4. The MEMS device of claim 1 wherein said lateral stop structure resides in an opening extending through said proof mass.

5. The MEMS device of claim 1 wherein said lateral stop structure comprises:
a central anchor;
a first extension member; and
a second extension member, said first and second extension members extending from opposing sides of said central anchor, wherein a length of each of said first and second extension members is aligned substantially parallel with said first direction of movement of said proof mass.

6. The MEMS device of claim 5 wherein said gap is a first gap section, and each of said first and second extension members includes a proximal end coupled to said central anchor and a distal end, said distal end of said first extension member being spaced apart from said proof mass by said first gap section, and said distal end of said second extension member being spaced apart from said proof mass by a second gap section having said first width, said second gap section being exposed from said cap.

7. The MEMS device of claim 6 wherein said each of said first and second extension members includes side walls extending between said proximal and distal ends, said side walls being spaced apart from said proof mass by said gap region underlying said cap.

8. The MEMS device of claim 6 wherein said lateral stop structure further comprises:
a third extension member; and
a fourth extension member, said third and fourth extension members extending from opposing sides of said central anchor and a second length of said third and fourth extension members being oriented approximately perpendicular to said length of said first and second extension members to form a cross-shaped lateral stop structure, said third and fourth extension members limiting deflection of said proof mass in a third direction substantially perpendicular to said first and second directions.

9. The MEMS device of claim 8 wherein each of said third and fourth extension members includes a proximal end coupled to said central anchor and a distal end, said distal end of said third extension member being spaced apart from said proof mass by a third gap section, and said distal end of said fourth extension member being spaced apart from said proof mass by a fourth gap section, each of said third and fourth gap sections exhibiting said first width, and said each of said third and fourth gap sections being exposed from said cap.

10. The MEMS device of claim 9 wherein said each of said first, second, third, and fourth extension members includes side walls extending between said proximal and distal ends thereof, said side walls being spaced apart from said proof mass by said gap region underlying said cap, and said gap region having said second width that is greater than said first width.

11. A microelectromechanical systems (MEMS) device comprising:
a substrate;
a proof mass positioned in spaced apart relationship above a surface of said substrate, said proof mass being adapted to move relative to said substrate; and
an over-travel stop structure including:
a lateral stop structure coupled to said substrate and residing in an opening extending through said proof mass, said lateral stop structure and said proof mass being spaced apart by a gap in a first direction of travel of said proof mass, said gap having a first width, said lateral stop structure being configured to limit deflection of said proof mass in said first direction substantially parallel to said surface of said substrate; and
a cap coupled to said lateral stop structure and configured to limit deflection of said proof mass in a second direction away from said substrate, wherein said cap overlies at least a portion of said lateral stop structure with an entirety of said first width of said gap being exposed from said cap, and said lateral stop structure and said proof mass are spaced apart by a gap region underlying said cap, said gap region exhibiting a second width that is greater than said first width.

12. The MEMS device of claim 11 wherein said first width is no greater than one micron, and said second width is greater than one micron.

13. The MEMS device of claim 11 wherein said lateral stop structure comprises:
a central anchor;
a first extension member; and
a second extension member, said first and second extension members extending from opposing sides of said central anchor, and a length of each of said first and second extension members being aligned substantially parallel with said first direction of movement of said proof mass.

14. The MEMS device of claim 13 wherein said lateral stop structure further comprises:
a third extension member; and
a fourth extension member, said third and fourth extension members extending from opposing sides of said central anchor and a second length of said third and fourth extension members being oriented approximately perpendicular to said length of said first and second extension members to form a cross-shaped lateral stop structure, said third and fourth extension members limiting deflection of said proof mass in a third direction substantially perpendicular to said first and second directions.

15. The MEMS device of claim 14 wherein:
said gap is a first gap section;
each of said first, second, third, and fourth extension members includes a proximal end coupled to said central anchor and a distal end;
said distal end of said first extension member is spaced apart from said proof mass by said first gap section;
said distal end of said second extension member is spaced apart from said proof mass by a second gap section;
said distal end of said third extension member is spaced apart from said proof mass by a third gap section; and
said distal end of said fourth extension member is spaced apart from said proof mass by a fourth gap section, each of said first, second, third, and fourth gap sections having said first width, and said each of said first, second, third, and fourth gap sections being exposed from said cap.

16. The MEMS device of claim 15 wherein said each of said first, second, third, and fourth extension members includes side walls extending between said proximal and distal ends thereof, said side walls being spaced apart from said proof mass by said gap region underlying said cap.

* * * * *